United States Patent [19]
Hasagawa et al.

[11] Patent Number: 5,590,080
[45] Date of Patent: Dec. 31, 1996

[54] DYNAMIC RANDOM ACCESS MEMORY WITH VARIABLE SENSE-AMPLIFIER DRIVE CAPACITY

[75] Inventors: Takehiro Hasagawa; Yukihito Oowaki, both of Kanagawa-ken, Japan

[73] Assignee: Kabushiki Kaisha Toshiba, Kanagawa-ken, Japan

[21] Appl. No.: 527,264

[22] Filed: Sep. 12, 1995

[30] Foreign Application Priority Data

Sep. 17, 1994 [JP] Japan ................................. 6-248435

[51] Int. Cl.$^6$ ................................. G11C 7/00; G11C 8/00
[52] U.S. Cl. ........................ 365/201; 365/205; 365/207; 365/230.06
[58] Field of Search ........................... 365/230.06, 201, 365/205, 207; 327/51, 57

[56] References Cited

U.S. PATENT DOCUMENTS

| | | | |
|---|---|---|---|
| 4,739,500 | 4/1988 | Miyamoto et al. | 365/207 |
| 5,424,990 | 6/1995 | Ohsawa | 365/205 |

OTHER PUBLICATIONS

Hasegawa et al., "WP3.3: An Experimental DRAM with a NAND–Structured Cell", IEEE International Solid–State Circuits Conference, Session 3, pp. 46–47, 1993.

Kimura et al., "A Block–Oriented RAM with Half–Sized DRAM Cell and Quasi–Folded Data–Line Architecture", IEEE International Solid–State Circuits Conference, Session 6, pp. 106–107, 297, 1991.

*Primary Examiner*—David C. Nelms
*Assistant Examiner*—Trong Phan
*Attorney, Agent, or Firm*—Finnegan, Henderson, Farabow, Garrett & Dunner, L.L.P.

[57] ABSTRACT

A dynamic semiconductor memory device comprises a memory array by which memory-cell units having a plurality of dynamic type memory cells connected in series are arranged in a matrix. Sense-amplifier circuits compare and amplify potential difference of a pair of data lines connected to the memory-cell units. Sense amplifier drivers charge or discharge the data lines. The memory further comprises means for changing drive capacity of the sense amplifier driver during reading-out and either restoring or writing. For example, by making the restoring or writing drive capacity smaller than the reading drive capacity, electric charge or discharge peak currents of the data lines line can be reduced.

31 Claims, 5 Drawing Sheets

DYNAMIC RANDOM ACCESS MEMORY WITH VARIABLE SENSE-AMPLIFIER DRIVE CAPACITY

BACKGROUND OF THE INVENTION

1. Field of the Invention

This invention relates to the field of semiconductor memory devices. In particular, this invention relates to semiconductor memory devices in which drive capacity of a sense-amplifier driver can be varied.

2. Description of the Related Art

DRAMs comprising a memory-cell unit made up of a plurality of memory cells connected to a bit line via a bit line contact have been developed. For example, a NAND-type DRAM can comprise a memory-cell unit made up of a plurality of memory cells. Since bit-line contacts of the NAND-type DRAM are smaller than those of a DRAM which connects each memory cell via corresponding bit line contacts to a bit line, cell area can be reduced using NAND-type DRAMs.

When reading data from the memory-cell unit of a NAND-type DRAM, data is read from the cells closest to the bit-line contact one at a time. Data read from the cells can be restored to the cells by providing the data to the cells farthest away from the bit line contact in a sequence reversed from the read sequence. For this reason, sense amplifiers must be operated twice for every bit of data during the reading-out and restoring operations.

To reduce the number of times the sense amplifiers must be operated, a method has been developed, in which a bit line of the sense-amplifier section is electrically separated from a bit line of the cell array section, thereby permitting only the signal of the bit line of the sense-amplifier section to be amplified during reading-out operation. Such a method is described in IEEE ISSCC DIGEST OF TECHNICAL PAPERS, vol. P28, WP3.4, 1993. According to this method, since only the bit line of the sense-amplifier section, which has a light capacity, is amplified in the sense-amplifier operation, currents, especially the peak currents accompanied by the operation, can be reduced. In contrast, during the restoring operation, there is a problem that currents may become large since the bit line of the cell array section must be amplified. This problem may led to an increase in power-supply noise.

Moreover, the cycle time of writing data to a memory cell is determined according to a drive capacity of the sense-amplifier driver. Usually, as compared with a serial cycle time of the reading-out operation, a serial cycle time of the writing operation is longer. Thus, because of such an imbalance in the cycle times, problems in the system design of DRAM may occur.

SUMMARY OF THE INVENTION

The purpose of this invention is to provide a semiconductor memory device in which currents accompanied by the sense-amplifier operation during the restoring operation or writing operation and the power-supply noise are decreased, without changing the sense speed during the reading-out operation.

Another purpose of this invention is to provide a semiconductor memory device which can arbitrarily set up serial cycle times of reading-out and restoring operations and to achieve an easy system design.

Namely, this invention provides a semiconductor memory device comprising a memory cell array comprising a plurality of memory-cell units arranged in a matrix, each memory-cell unit comprising a plurality of connected memory cells; a plurality of sense-amplifier circuits, each corresponding to at least one memory-cell unit for comparing and amplifying a potential difference of data lines of the corresponding memory-cell units; a plurality of sense-amplifier drivers for charging or discharging the data lines; and means for changing drive capacity of the plurality of sense-amplifier circuit drivers during reading-out, restoring, and writing.

Moreover, this invention provides a semiconductor memory device comprising a memory cell array comprising a plurality of memory-cell units arranged in a matrix, each memory-cell unit comprising a plurality of connected memory cells; a plurality of sense-amplifier circuits, each corresponding to at least one memory-cell unit for comparing and amplifying a potential difference of data lines of the corresponding memory-cell units; a plurality of sense-amplifier drivers for charging or discharging the data lines; and means for changing a serial data reading-out cycle time and a serial data writing cycle time.

According to this invention, by changing the drive capacity of a sense-amplifier driver during reading-out and writing operations, currents accompanied by the sense-amplifier operation during writing are decreased and power-supply noise is reduced, or the cycle time during the reading-out operation is brought close to the cycle time of writing. Therefore, this invention improves the flexibility of the design of semiconductor memory devices, such as DRAMs.

More specifically, for example, if drive capacity of the sense-amplifier driver is made smaller during the writing operation than during the reading-out operation, the currents accompanied by the sense-amplifier operation during the writing operation can be decreased, without changing the sense speed during the reading-out operation. Therefore, the power-supply noise during the writing operation can be reduced.

Moreover, in accordance with the invention, if drive capacity of the sense-amplifier driver is enlarged, the cycle time during the writing operation can be made reduced. Therefore, the cycle time during the reading-out operation and the cycle time during the writing operation can be brought close to each other or made the same.

Desirable aspects of this invention are described below.

(1) The memory cell of the invention is preferably a dynamic-type memory cell.

(2) The memory-cell unit of the invention is preferably a NAND cell comprising a plurality of series-connected memory cells coupled to a bit line via a one bit line contact.

(3) Drive capacity of a sense-amplifier driver during the restoring operation or the writing operation can be made smaller than the drive capacity during the reading-out operation, so as to reduce a discharge peak current or charge peak current of a pair of data lines.

(4) Drive capacity of a sense-amplifier driver can be enlarged, so as to make a cycle time of the restoring or writing operation close to or the same as the cycle time of the reading-out operation.

(5) Drive capacity of a sense-amplifier driver can be changed for each memory array block and for each chip.

(6) Drive capacity of a sense-amplifier driver can be changed using an external signal.

DETAILED DESCRIPTION OF THE PREFERRED EMBODIMENT

Hereinafter, the embodiments of this invention are explained in detail with reference to the appended drawings.

Figure 1:
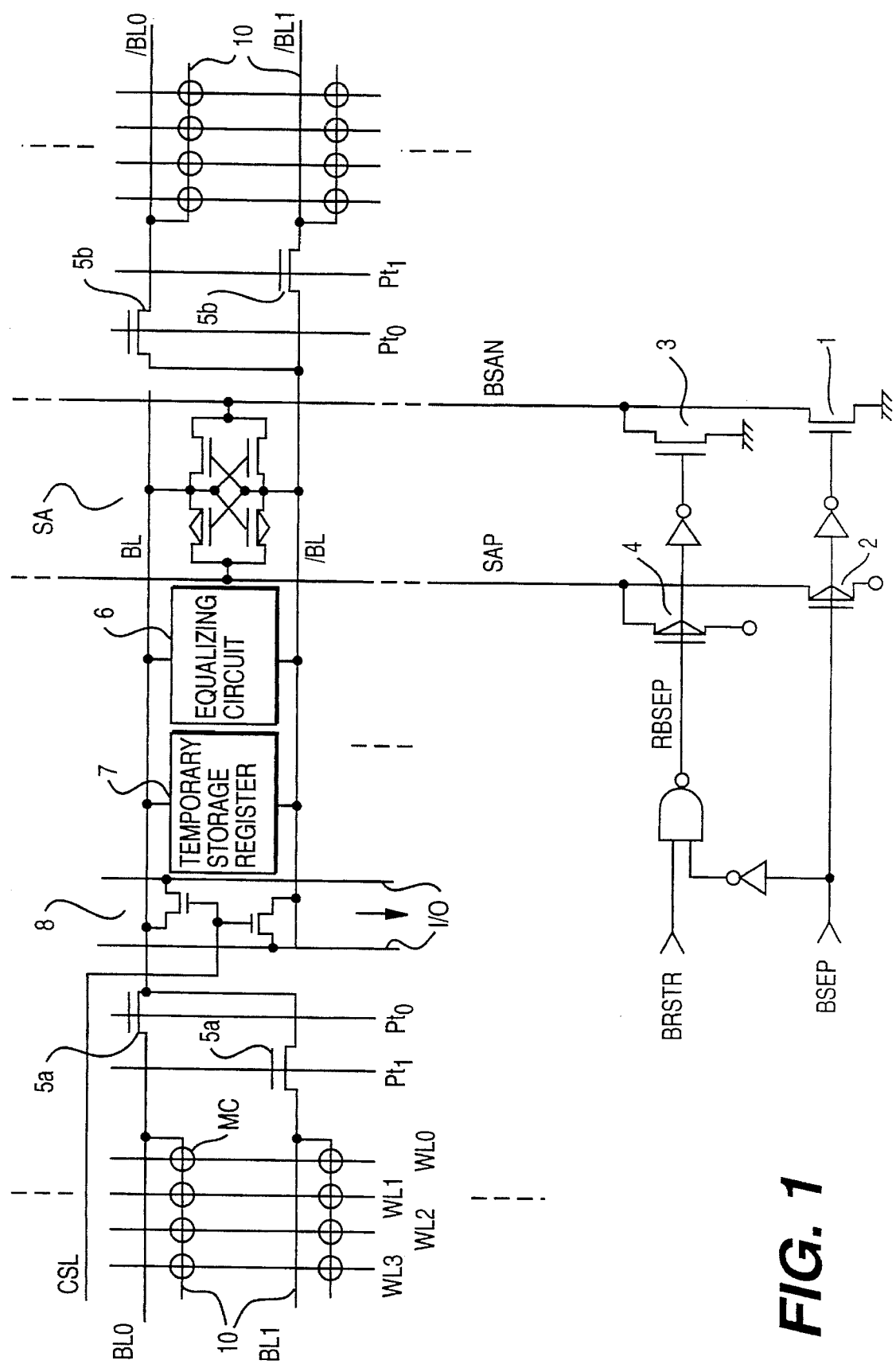
FIG. 1 is an equivalent circuit showing a circuit arrangement of a semiconductor memory device in connection with the first embodiment of this invention.

FIG. 1 shows the equivalent-circuit showing a circuit arrangement of a semiconductor memory device in connection with the first embodiment of this invention. In this embodiment, drive capacity of transistors serving as sense-amplifier drivers are changed during the reading-out operation and either the restoring operation or the writing operation. A NAND cell which constitutes a memory-cell unit 10 by connecting a plurality of memory cells MC in series is formed on a wafer. Each memory cell is a DRAM, preferably comprising one transistor and one capacitor. A memory-cell array is formed by arranging a plurality of NAND cells in a matrix. Each NAND cell is arranged in an open bit-line scheme, while the end section of the NAND cell is connected to a bit line via a bit line contact. Moreover, a pair of bit lines BL0 and BL1 share one sense-amplifier SA. In an alternative embodiment, a different number of bit lines could share sense-amplifier SA. Also, it is possible for the bit lines not to be shared by the sense-amplifier SA. Moreover, although not shown in this figure, a circuit which equalizes SAP and BSAN could be included.

In this embodiment, two pMOS transitions and two nMOS transistors serve as a sense-amplifier driver. nMOS transistor 1 and pMOS transistor 2 are activated when BSEP signal is "L" during the reading-out operation and either the restoring operation or the writing operation. On the other hand, nMOS transistor 3 and pMOS transistor 4 are not activated when BRSTR signal is "L" during the writing operation. BRSTR signal may be generated inside a chip using a counter, or inputted from outside the chip. In addition, transistors 5a in FIG. 1 represent circuits for connecting bit line BL of sense-amplifier SA to either of bit lines BL0 and BL1 of the cell array section, and transistors 5b are circuits for connecting bit line/BL of the sense-amplifier section to either of bit lines /BL0 and /BL1 of the cell array section. Transistors 5a and 5b are controlled by control signals Pt0 and Pt1. Between sense-amplifier SA and memory cells, an equalizing circuit 6 for equalizing the pair of bit lines, a temporary storage register 7 which temporarily memorizes data of one NAND cell, and an output circuit 8 comprising transistors for outputting the result of sensing to an external input/output lines I/O are provided. The output of sensing result to I/O line is controlled by column selection signal line CSL.

Figure 2:
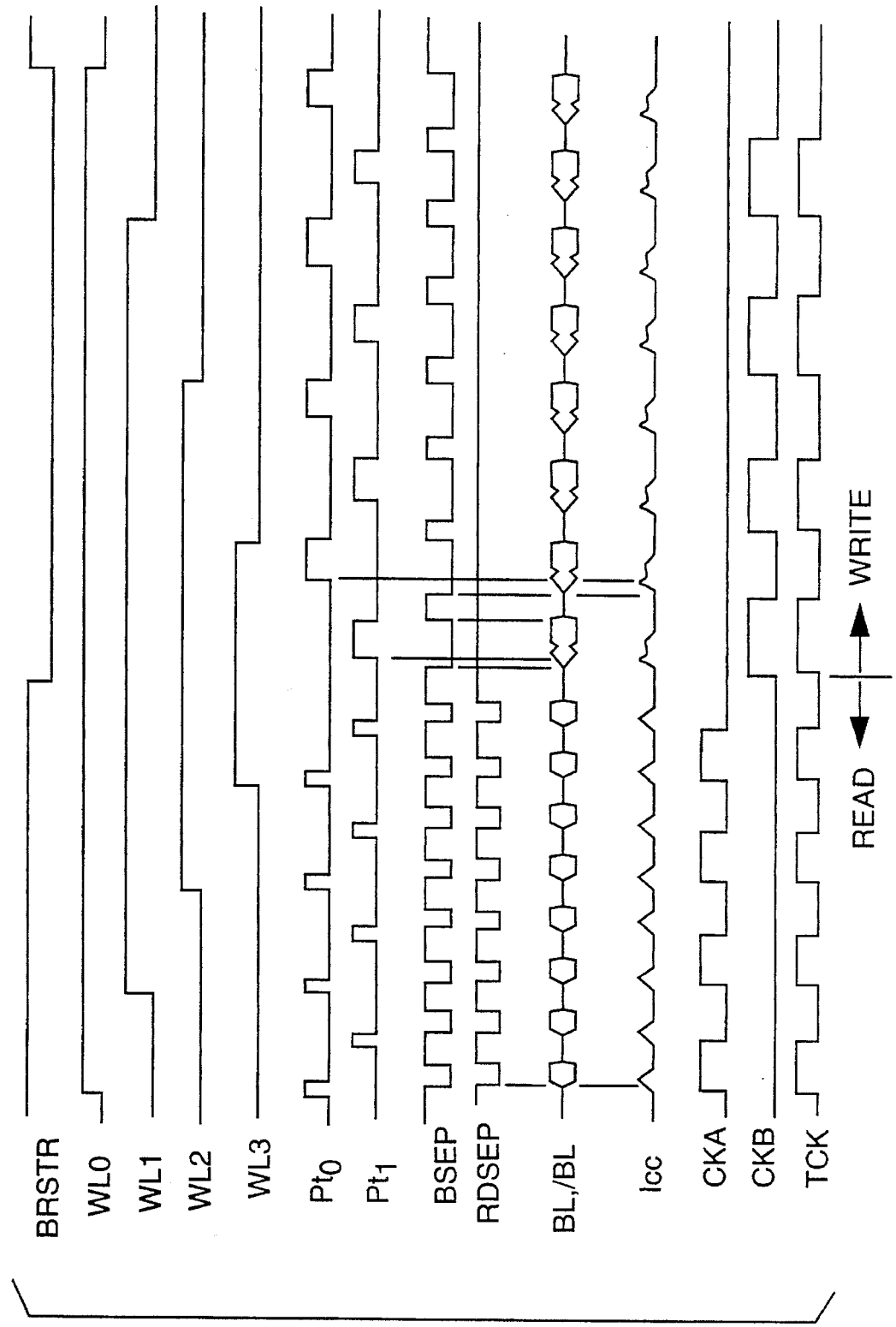
FIG. 2 is a timing-chart showing the timing of operation for the first embodiment of this invention.

FIG. 2 shows a timing-chart diagram of the operation of the first embodiment of this invention. During reading-out, each word lines WL0, WL1, WL2, and WL3 are activated in this order one by one, and data is read out to the sense-amplifier. At this time, the bit lines BL0 and BL1 of the cell array section and of sense-amplifier SA section in FIG. 1 are electrically separated (Pt0 and Pt1 are "L") and the sense operation is performed. That is, since nMOS transistors 1 and 3 and pMOS transistors 2 and 4 perform only charge and discharge of the bit line BL and/BL capacity of sense-amplifier SA, currents can be made small and high speed reading can be performed. In addition, although omitted from the timing chart, each data is stored in the temporary storage register 7 provided in the sense-amplifier SA after sensing.

In addition, restoring data or writing data to the memory cells from the temporary-storage register 7 is carried out in a sequence contrary to the sequence carried out during the reading operation (not shown). Data read from the temporary-storage register 7 is amplified by sense-amplifier SA, which charges or discharges the bit lines of the cell array section and writes the data in memory cell MC. Since capacity of the bit lines BL0 and BL1 of the cell array section is charged or discharged at sensing, many charges are consumed as compared to during the reading-out operation. That is, when the sense operation during restoring or writing is performed at the same speed as the sense operation during reading-out, peak currents become large and increase power-supply noise.

Thus, by making the drive capacity of the sense-amplifier driver variable so that the drive capacity during restoring or writing can be made smaller than the drive capacity during reading, peak currents accompanied by the sense operation during writing can be decreased, thereby reducing power-supply noise. For example, BSEP signal and BRSTR signal are controlled at writing to "L", thereby activating only nMOS transistor 1 and pMOS transistor 2, as specifically shown in the timing chart of FIG. 2. In addition, if BSEP signal is controlled to "L", BRSTR signal is controlled to "H", nMOS transistors 1 and 3 and pMOS transistors 2 and 4 are activated during reading-out.

The second embodiment of this invention will now be explained. When the drive capacity of the sense-amplifier driver becomes smaller during writing, as explained above in connection with the first embodiment, the sense speed becomes slower. Therefore, a circuit which can change a serial reading-out cycle time during the reading-out operation and a serial write-in cycle time during the writing operation may be additionally provided.

Figure 3:
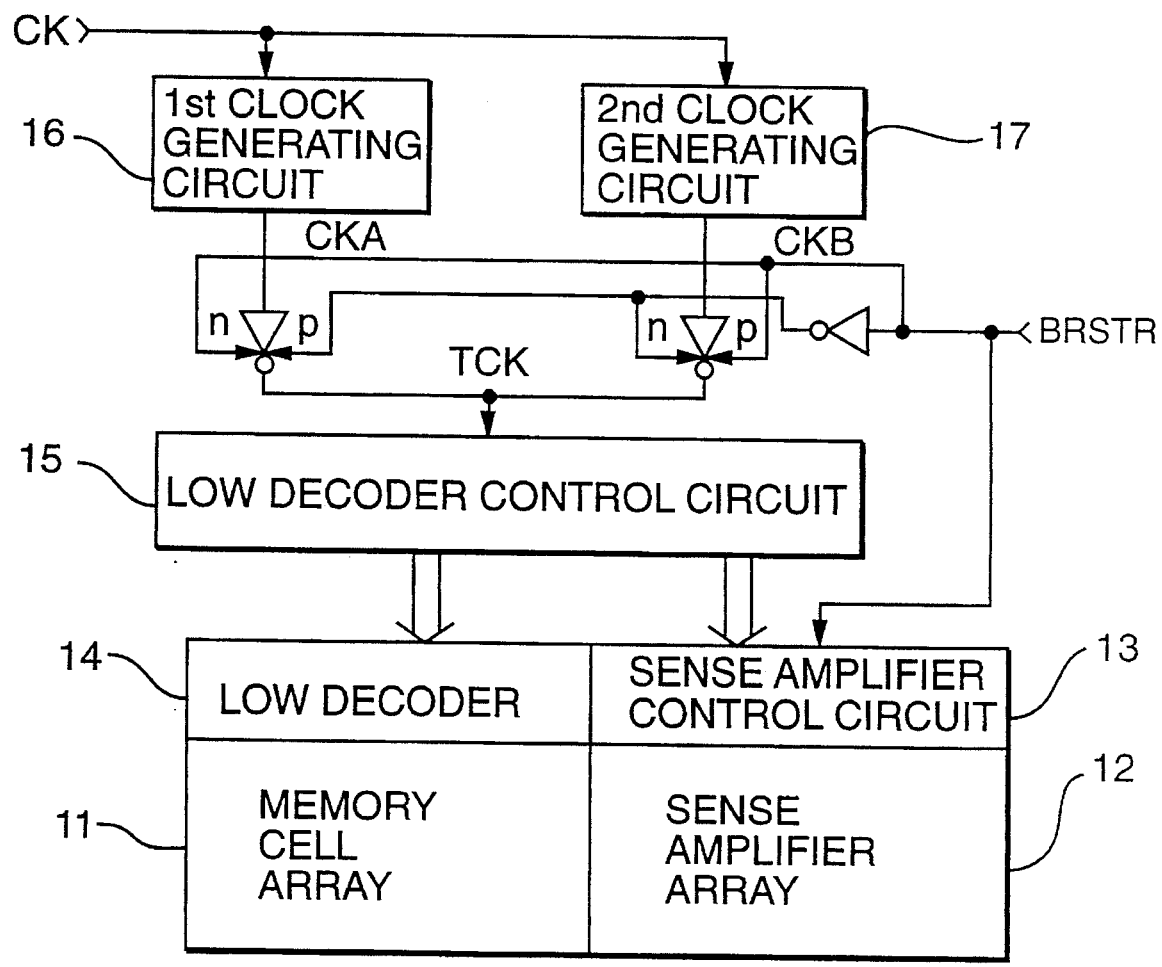
FIG. 3 is a block diagram showing a composition of the semiconductor memory device in connection with the second embodiment of this invention.

FIG. 3 is a block diagram showing the composition of the second embodiment of the invention. On the peripheral circuit of a memory cell array 11 to which cells, such as DRAM, are arranged in a matrix, a low decoder 14 for specifying an arbitrary cell, a low decoder control circuit 15 for controlling the decoder, a sense amplifier array 12 for sensing data of the memory cell, and a sense amplifier control circuit 13 for controlling the sense amplifier array are provided. A first clock generating circuit 16 and a second clock generating circuit 17, which are controlled by clock signal CK, are connected to the low control circuit 15. Serial reading-out and serial restoring or writing are performed on the basis of the clock CK. During the reading-out operation, control of the low control circuit is performed by clock CKA generated in the first-clock generating circuit 16. During the restoring or writing operation, control of the low control circuit is performed by clock CKB generated in the second clock generating circuit 17. A circuit which can choose between these clocks CKA and CKB is provided between the clock generating circuits 16 and 17 and the low control circuit 15. Selection of clocks CKA and CKB is performed using BRSTR signal, as previously explained.

Signals from clocks CKA and CKB are illustrated in the timing chart of FIG. 2. The clock CK shown in FIG. 3 may be generated inside a chip or outside the chip like synchronous DRAM. Moreover, a divider circuit dividing clock CK may be considered as the first clock generating circuit 16 and second clock generating circuit 17. As for the cycle of clock CKA, it is preferably shorter than the cycle of clock CKB.

Figure 4:
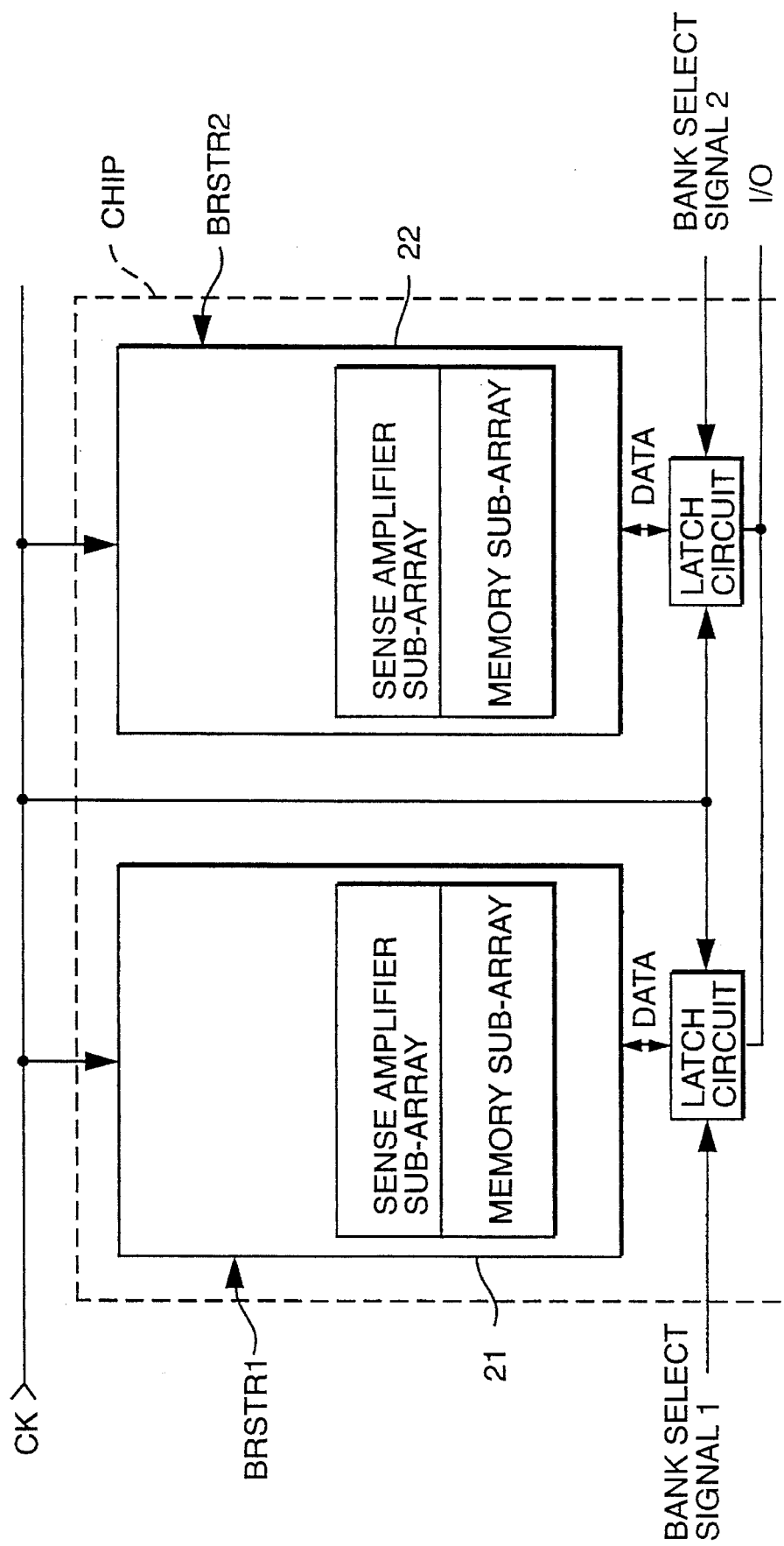
FIG. 4 is a block diagram showing a composition of the semiconductor memory device in connection with the third embodiment of this invention.

In accordance with the third embodiment of this invention, an array of NAND type memory-cell unit is formed from a plurality of banks. This is shown in FIG. 4.

In a chip, there are preferably at least two blocks, each of which corresponds to the circuit array shown in FIG. 3, and is called a "bank." A common clock CK is inputted into each block 21 and 22, and BRSTR1 signal is inputted into the first block 21, and BRSTR2 signal is inputted into the second block 22. Memory sub-arrays in the blocks 21 and 22 contain the array of NAND type memory-cell unit 10 shown in FIG. 1, respectively. When the array of NAND type memory-cell unit is formed from a plurality of banks, while a certain bank is active, other banks can perform the writing operation or restoring operation. Therefore, though the time of writing becomes long, it does not appear to pose a problem. Latch circuits synchronize reading or writing of data from I/O line with clock CK.

If this invention is used for a plurality of banks, even if many banks are operated simultaneously, current noise can be minimized. In this case, drive capacity of the sense-amplifier driver can be changed according to the number of banks. Also, cycle of writing can be changed according to the number of banks. For example, if the number of banks is larger, drive capacity of the sense-amplifier driver will be reduced, or the cycle time of serial writing will be lengthened.

The control signal which changes drive capacity of the sense-amplifier driver in the first, the second, and the third embodiments could be a signal inputted from outside a chip. For example, when simultaneously testing a plurality of chips, the drive capacity of the sense-amplifier driver can be changed independently or simultaneously, or can be changed for every chip. Accordingly, test time is shortened and a plurality of chips can be tested stably and efficiently.

Figure 5:
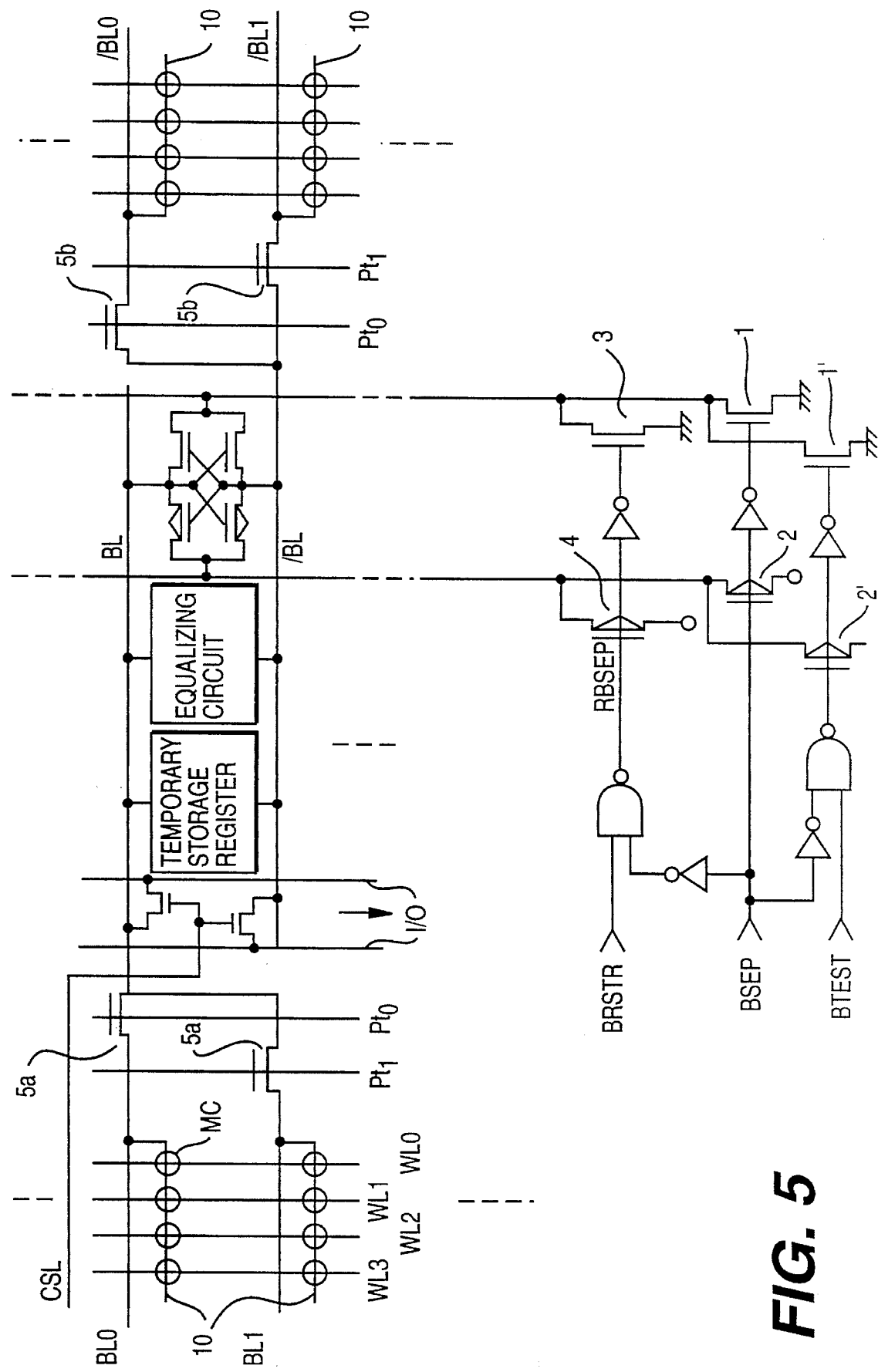
FIG. 5 is an equivalent circuit showing the circuit arrangement of the semiconductor memory device in connection with the fourth embodiment of this invention.

In accordance with the fourth embodiment of the invention, an equivalent circuit of the semiconductor memory device is shown in FIG. 5. In addition to the composition of FIG. 1, nMOS transistor 1' is connected in parallel with the nMOS transistor 1. pMOS transistor 2' is connected in parallel with the pMOS transistor 2. nMOS transistors 1, 1' and pMOS transistors 2, 2' are activated when BSEP signal is set to "L" during the reading-out and writing operations. nMOS transistor 3 and pMOS transistor 4 are not activated when BRSTR signal is set to "L" during writing. Furthermore, at the time that nMOS transistor 1' and pMOS transistor 2' are tested, BTEST signal are not activated when BTEST signal is set to "L".

With such a composition, when a plurality of chips are tested simultaneously, current simultaneously consumed in a plurality of chips can be decreased by setting BTEST signal to "L" and lowering drive capacity. Therefore, a power-supply noise can be decreased and the stable test is attained.

Moreover, the signal which changes drive capacity of the sense-amplifier driver can be used when activating simultaneously a plurality of memory array blocks in a chip. For example, when data of a certain memory array block or memory bank is accessed from outside, a memory array block, or memory bank, that has not been accessed is refreshed. The refreshment of the memory block or bank is not apparent. At this time, the power-supply noise by the refresh can be reduced by decreasing drive capacity of the sense amplifier driver, which is included in the bank to be refreshed. Therefore, stable reading-out operation and stable refreshment operation can be performed simultaneously. In this case, BTEST signal in FIG. 5 is independently operated for each memory array block and each memory bank.

In this invention, it is preferred that changing the drive capacity of the sense-amplifier driver during reading-out and during either restoring or writing is different from changing the serial reading-out cycle and the serial writing cycle. That is, the changes preferably do not occur at the same time, although they could.

For example, the reading cycle time and the writing cycle time can be set at the same value, while the drive capacity of the sense-amplifier driver can be changed. In such case, if precharge time during reading-out is lengthened and the unbalance between the bit lines of precharge level is decreased, the margin during reading-out will become good. Thus, it is possible to regulate within 1 cycle.

Generally, a writing cycle time becomes longer than a reading cycle time, because of the difference of the capacity loads. If drive capacity of the sense-amplifier driver is enlarged during writing when the capacity load is large, as compared with the reading-out, the cycle times will be brought close to one another or made the same. Thus, a system design will become easy if the cycle time of writing is the same as the cycle time of reading-out.

In addition, this invention is not limited to the embodiments described herein. This invention covers modifications of the embodiments falling within the scope of the appended claims and their equivalents. For example, a dynamic type memory cell is used in the described embodiments. However, this invention could be applicable to a memory device, in which data is read from a cell one by one and is written in again one by one. For example, the principles described herein could be applied to a static-type memory. Furthermore, although the invention has been described in connection with a NAND-type DRAM, the principles are also applicable to other types of memory devices that comprise a memory-cell unit made up of a plurality of connected memory cells. Moreover, the invention can be implemented using a memory device that is not a memory-cell unit, but rather, for example, a memory device having a bit line electrically separated from a sense amplifier during the reading-out operation.

What is claimed is:

1. A semiconductor memory device comprising:
    a memory cell array comprising a plurality of memory-cell units arranged in a matrix, each memory-cell unit comprising a plurality of connected memory cells;
    a plurality of sense-amplifier circuits, each corresponding to at least one memory-cell unit, for comparing and amplifying a potential difference of data lines of respective corresponding memory-cell units;
    a plurality of sense-amplifier drivers for charging or discharging the data lines; and
    means for changing drive capacity of the plurality of sense-amplifier circuit drivers during reading-out, restoring, and writing.

2. The semiconductor memory device according to claim 1, wherein the plurality of memory-cell units comprises a plurality of series-connected dynamic type memory cells.

3. The semiconductor memory device according to claim 2, further comprising temporary storage registers coupled to said plurality of memory cells for temporarily storing data of said memory cells.

4. The semiconductor memory device according to claim 3, further comprising means for reading data out of said temporary storage registers and for sense amplifying said read data.

5. The semiconductor memory device according to claim 4, further comprising means for restoring data to said memory cells after said data has been read out of said temporary storage registers.

6. The semiconductor memory device according to claim 1, wherein the means for changing comprises means for making the drive capacity of the plurality of sense-amplifier drivers smaller during writing than during reading-out.

7. The semiconductor memory device according to claim 1, wherein the means for changing comprises means for making the drive capacity of the plurality of sense-amplifier drivers smaller during restoring than during reading-out.

8. The semiconductor memory device according to claim 1, wherein means for changing the drive capacity of the plurality of sense-amplifier drivers comprises a plurality of MOS transistors controlled by an external control signal.

9. The semiconductor memory device according to claim 6, wherein the means for changing the drive capacity of the plurality of sense-amplifier driver comprises a plurality of MOS transistors controlled by an external control signal.

10. The semiconductor memory device according to claim 7, wherein the means for changing the drive capacity of the plurality of sense-amplifier drivers comprises a plurality of MOS transistors controlled by an external control signal.

11. The semiconductor memory device according to claim 8, wherein the plurality of MOS transistors includes at least four p channel or n channel MOS transistors, at least one of the transistors being connected to a high source voltage and remaining ones of the transistors being connected to a low source voltage.

12. The semiconductor memory device according to claim 8, further comprising means for utilizing the high and low source voltages during reading out and for utilizing at least one of the high and low source voltages during restoring or writing.

13. The semiconductor memory device according to claim 1, further comprising means for changing the drive capacity of the plurality of sense-amplifier drivers for each memory array.

14. A semiconductor memory device comprising:
a memory cell array comprising a plurality of memory-cell units arranged in a matrix, each memory-cell unit comprising a plurality of connected memory cells;
a plurality of sense-amplifier circuits, each corresponding to at least one memory-cell unit, for comparing and amplifying a potential difference of data lines of respective corresponding memory-cell units;
a plurality of sense-amplifier drivers for charging or discharging the data lines; and
means for changing a serial data reading-out cycle time and a serial data writing cycle time.

15. The semiconductor memory device according to claim 14, further comprising means for changing the drive capacity of the sense-amplifier driver during reading out and during restoring or writing.

16. The semiconductor memory device according to claim 15, further comprising means for changing the drive capacity of the plurality of sense-amplifier drivers such that the drive capacity is larger during restoring or writing than during reading out.

17. The semiconductor memory device according to claim 15, further comprising means for changing the drive capacity of the plurality of sense-amplifier drivers for each memory array.

18. The semiconductor memory device according to claim 14, wherein the plurality of memory-cell units comprises a plurality of dynamic type memory cells connected in series.

19. The semiconductor memory device according to claim 18, further comprising temporary storage registers coupled to said plurality of memory cells, which temporarily store data of said memory cells.

20. The semiconductor memory device according to claim 19, further comprising means for reading data out of said temporary storage registers to said plurality of sense-amplifier circuits and for amplifying said data during reading.

21. The semiconductor memory device according to claim 20, further comprising means for restoring data to said memory cells after said data has been read out of said temporary storage registers.

22. The semiconductor memory device according to claim 14, wherein the means for changing comprises a plurality of MOS transistors controlled by an external control signal.

23. The semiconductor memory device according to claim 22, wherein said plurality of MOS transistors includes at least four p channel or n channel MOS transistors, at least one of the transistors being connected to a high source voltage and remaining ones being connected to a low source voltage.

24. The semiconductor memory device according to claim 23, further comprising means for utilizing the high and low source voltages during writing or restoring and for utilizing at least one of the source voltages during reading out.

25. The semiconductor memory device according to claim 14, wherein the means for changing the cycle time comprises a first clock generating circuit for outputting a predetermined cycle and a second clock generating circuit for outputting a cycle longer than the predetermined cycle.

26. The semiconductor memory device according to claim 25, further comprising means for utilizing output from the first clock generating circuit during reading out as a trigger for the reading out operation and for utilizing output from the second clock generating circuit during restoring or writing as a trigger for the restoring or writing operation.

27. A memory comprising a plurality of chips, each of the chips having mounted thereon:
a memory cell array comprising a plurality of memory-cell units arranged in a matrix, each memory-cell unit comprising a plurality of connected memory cells;
a plurality of sense-amplifier circuits, each corresponding to at least one memory-cell unit, for comparing and amplifying a potential difference of data lines of respective corresponding memory-cell units;
a plurality of sense-amplifier drivers for charging or discharging the data lines; and
means for changing drive capacity of the plurality of sense-amplifier circuit drivers during reading-out, restoring, and writing.

28. The memory according to claim 27, wherein the drive capacity of the plurality of sense-amplifier drivers is changed for each chip.

29. A memory comprising a plurality of chips, each of the chips having mounted thereon:
a memory cell array comprising a plurality of memory-cell units arranged in a matrix, each memory-cell unit comprising a plurality of connected memory cells;
a plurality of sense-amplifier circuits, each corresponding to at least one memory-cell unit, for comparing and amplifying a potential difference of data lines of respective corresponding memory-cell units;

a plurality of sense-amplifier drivers for charging or discharging the data lines; and means for changing a serial data reading-out cycle time and a serial data writing cycle time.

30. The memory according to claim 29, further comprising means for changing the drive capacity of the plurality of sense-amplifier drivers for each chip.

31. The semiconductor memory device according to claim 29, wherein means for changing drive capacity of the sense-amplifier driver further comprises means for lowering the drive capacity at the time of simultaneous testing for a plurality of chips.

* * * * *